United States Patent

Urano et al.

[11] Patent Number: 6,010,568
[45] Date of Patent: Jan. 4, 2000

[54] METHOD FOR ADJUSTING INITIAL POSITION OF MELT SURFACE

[75] Inventors: Masahiko Urano, Takasaki; Atsushi Ozaki, Annaka; Tomohiro Kakegawa, Tomioka; Hideki Nakano, Sawa, all of Japan

[73] Assignee: Shin-Estu Handotai Co., Ltd., Tokyo, Japan

[21] Appl. No.: 09/226,106

[22] Filed: Jan. 7, 1999

Related U.S. Application Data

[62] Division of application No. 08/760,963, Dec. 5, 1996, Pat. No. 5,888,299.

[30] Foreign Application Priority Data

Dec. 27, 1995 [JP] Japan .................................. 7-351274

[51] Int. Cl.⁷ .................................................. C30B 15/26
[52] U.S. Cl. ............................... 117/14; 117/15; 117/201; 117/202
[58] Field of Search ............................... 117/14, 15, 16, 117/201, 202

[56] References Cited

U.S. PATENT DOCUMENTS 3,621,213  11/1971  Jen et al. ................................. 117/202
5,286,461   2/1994  Kozioh et al. .......................... 117/201

FOREIGN PATENT DOCUMENTS

| 301998 | 2/1989 | European Pat. Off. . |
| 303977 | 2/1989 | European Pat. Off. . |
| 444628 | 9/1991 | European Pat. Off. . |
| 536405 | 4/1993 | European Pat. Off. . |
| 5-59876 | 3/1993 | Japan . |

Primary Examiner—Felisa C. Hiteshew
Attorney, Agent, or Firm—Oliff & Berridge, PC

[57] ABSTRACT

An apparatus and a method capable of automatically adjusting an initial position of the surface of a melt without an operator are provided. In a single crystal puller using a wire as a suspender for a seed crystal for growing a single crystal of silicon or the like according to the CZ method, a reference position of the seed crystal is detected, the wire is unwound to lower the end of the wire to a position higher by a distance W–X from the reference position and then pulled upward above said reference position to correct the wire for an extension due to the weight of a single crystal attached thereto. Also, the wire is left above a melt for about ten minutes to provide a constant amount of extension to the wire due to heat of the melt. These operations are automatically performed.

5 Claims, 4 Drawing Sheets

METHOD FOR ADJUSTING INITIAL POSITION OF MELT SURFACE

This is a Division of application Ser. No. 08/760,963 filed Dec. 5, 1996, now U.S. Pat. No. 5,538,299. The entire disclosure of the prior application is hereby incorporated by reference herein in its entirety.

BACKGROUND OF THE INVENTION

1. Field of the Invention

The present invention relates generally to a single crystal puller for melting a polycrystalline material and pulling a seed crystal from the melt of the polycrystalline material to produce a single crystal, and more particularly to a position adjusting apparatus for adjusting an initial vertical position of the surface of a melt when a crystal growth is started in the single crystal puller.

2. Description of the Related Art

Conventionally, a Czochralski method (hereinafter referred to as the "CZ method") is known as a method of producing a single crystal from a semiconductor polycrystalline material such as silicon. In the CZ method, a highly pure polycrystalline material is melt in a crucible or the like, and a seed crystal is brought into contact with the melt of the material and then pulled upwardly to produce a single crystal.

During the growth of a single crystal, an industrial television camera or the like, installed above the surface of the melt, is generally used to measure an apparent diameter d of a silicon single crystal on the interface between the single crystal and the melt. Then, the pulling rate is controlled to bring an actual diameter D to a predetermined value based on the apparent diameter d. In addition, adjustments of temperature and so on are performed to produce a silicon single crystal ingot substantially in a cylindrical shape.

The actual diameter D of a single crystal may be approximated by the following equation:

$$D=(\alpha+\beta X+\gamma X^2)\times d$$

where $\alpha$, $\beta$, and $\gamma$ and are predetermined constants, and X is expressed by $L-L_0$, where L is the distance between the position of an industrial television camera and the surface of a melt, and $L_0$ is a reference value for L. It should be noted that X/L is a very small number. Therefore, a change in the reference value $L_0$ causes a deviation in the relationship between the apparent diameter d measured by the industrial television camera and the actual diameter D, so that the diameter of a single crystal cannot be maintained at a predetermined value.

As a result, if a pulled single crystal has an actual diameter larger than a predetermined value, the outer periphery of the single crystal should be ground until the diameter of the single crystal is equal to the predetermined diameter value. Since it is a recent tendency to produce single crystals of larger diameters, the outer peripheral portion lost by the grinding has become an innegligible problem in view of a manufacturing cost.

Since the reference value $L_0$ for L is typically measured when a seed crystal is in contact with the surface of a melt at the beginning of a single crystal pulling operation, it is a critical problem to adjust the initial position of the melt surface as accurately as possible for the measurement. Thus, apparatuses for adjusting an initial position of the surface of a melt have been proposed for this purpose, and those disclosed in Japanese Patent Publication No. 5-59876 and so on are known.

Recently, it has been found, in single crystal pullers according to the CZ method which use a stranded wire as a suspender for a seed crystal in such a manner that the stranded wire is wound around a drum and unwound therefrom to raise and lower the seed crystal, that as a single crystal grows and becomes heavier, a tension is applied to the wire, which returns the wire in a direction in which the "strand" is loosened, and consequently the wire is extended. For this reason, when a single crystal is pulled upwardly, the wire is wound around a drum in an extended state, with the loosen "strand". However, when a new seed crystal is attached to the suspender after a produced single crystal ingot is removed, and the drum is rotated in the reverse direction to lower the seed crystal, no tension is applied to the wire to cause the strand to restore, whereby the wire become shorter than when it is wound around the drum. It has been found, as a result, that the wire extends approximately 10.0 millimeters per meter when a single crystal reaches a weight of 15 Kg, as can be seen from FIG. 1, thus producing a relatively large error. Therefore, when a moving distance of a single crystal is calculated from a rotating amount of the drum to determine an initial position of the surface of a melt based on this calculation, the extension and contraction of the wire will cause a large error in determining the initial position of the melt surface.

In addition, it has been found, in the above-mentioned single crystal puller according to the CZ method using a wire as a suspender for a seed crystal, that as the wire is left above a melt at a high temperature, the high temperature causes the wire to extend. It has been also found that the extension increases as the wire is left for a longer time. Specifically, as can be seen from FIG. 2, the wire extends 1.2 millimeters per three meters in ten minutes, and thereafter the wire does not extend any more even if it is left in the same situation. Thus, also in this case, when a moving distance of a single crystal is calculated from a rotating amount of the drum to determine an initial position of the surface of the melt based on this calculation, the extension and contraction of the wire will cause an error in determining the initial position of the melt surface.

Further, it has been found, in the above-mentioned single crystal puller according to the CZ method using a wire as a suspender for a seed crystal, that when a seed crystal is stopped at a reference position, the elevating rate of the seed crystal causes an error between the reference position and the position at which the seed crystal is actually stopped. A conventional single crystal puller is typically provided with a reference position sensor such that a motor for driving a drum is automatically stopped when the reference position sensor detects the tip of a seed crystal. However, a "time delay", though very short, is present from the time the reference position sensor detects the tip of a seed crystal to the time the seed crystal is actually stopped. This time delay causes a deviation from the reference position. Specifically, it has been found that the maximum deviation of the stopping position from the reference position is 0.7 millimeters with the moving rate of a seed crystal at 250 millimeters/minute. Thus, also in this case, when a moving distance of a single crystal is calculated from a rotating amount of the drum to determine an initial position of the surface of a melt based on this calculation, the erroneous stopping position will cause an error in the initial position of the melt surface.

Further, in the above-mentioned single crystal puller according to the CZ method using a wire as a suspender for a seed crystal, after an initial position of the melt surface has been measured, a seed crystal is once raised, and a crucible is then moved in the vertical direction for correctly positioning the crucible at a defined position based on the measured initial position of the surface of the melt. The seed crystal is once raised because if the crucible only were raised without changing the position of the seed crystal, the seed crystal would be submerged in the melt. However, the crucible elevating operation also causes an error in the initial position of the melt surface.

In the conventional methods mentioned above, operations for raising and lowering a seed crystal, vertically moving a crucible, and so on are manually performed by operators. Since the operators carefully manipulate for ensuring a sufficient accuracy, a long time is required for each of the operations. In addition, variations in manipulations depending on individual operators also affect the accuracy.

OBJECTS AND SUMMARY OF THE INVENTION

The present invention has been made for solving the above-mentioned problems, and it is an object of the present invention to provide an apparatus and method which can automatically adjust an initial position of the surface of a melt without requiring operator's manipulations.

To solve the above-mentioned problems, an apparatus for adjusting an initial position of the surface of the melt and a method of adjusting an initial position of the surface of the melt according to claims 1 and 6, for use in a single crystal puller and a single crystal pulling method having a heating container for heating a crystal material contained therein to melt the crystal material, a wire arranged for up and down movements above a melt of the crystal material in the heating container, a seed crystal attached to the wire, for growing a single crystal of the crystal material according to a pulling method, are characterized by detecting a reference position of the seed crystal and unwinding the wire to lower the end of the wire to a position spaced by a first predetermined distance from the reference position, and then pulling upward the wire above said reference position to correct the wire for an extension due to the weight of the single crystal attached to the wire.

Also, an apparatus for adjusting an initial position of the surface of the melt and a method of adjusting an initial position of the surface of the melt according to claims 2 and 7, for use in a single crystal puller and a single crystal pulling method having a heating container for heating a crystal material contained therein to melt the crystal material, a wire arranged for up and down movements above a melt of the crystal material in the heating container, a seed crystal attached to the wire, for growing a single crystal of the crystal material according to a pulling method, are characterized by leaving the wire above the melt for a predetermined time period to extend the wire due to heat by a constant amount.

Further, an apparatus for adjusting an initial position of the surface of the melt and a method of adjusting an initial position of the surface of the melt according to claims 3 and 8, for use in a single crystal puller and a single crystal pulling method having a heating container for heating a crystal material contained therein to melt the crystal material, a wire arranged for up and down movements above a melt of the crystal material in the heating container, a seed crystal attached to the wire, for growing a single crystal of the crystal material according to a pulling method, are characterized by lowering the seed crystal at a predetermined lowering rate to reduce an error in a position at which the seed crystal is stopped.

Further, an apparatus for adjusting an initial position of the surface of the melt and a method of adjusting an initial position of the surface of the melt according to claims 4 and 9, for use in a single crystal puller and a single crystal pulling method having a heating container for heating a crystal material contained therein to melt the crystal material, a wire arranged for up and down movements above a melt of the crystal material in the heating container, a seed crystal attached to the wire, for growing a single crystal of the crystal material according to a pulling method, are characterized by detecting a rate at which the heating container is raised and raising the heating container at a predetermined raising rate to adjust an initial position of the surface of the melt.

Further, an apparatus for adjusting an initial position of the surface of the melt and a method of adjusting an initial position of the surface of the melt according to claims 5 and 10, for use in a single crystal puller and a single crystal pulling method having a heating container for heating a crystal material contained therein to melt the crystal material, a wire arranged for up and down movements above a melt of the crystal material in the heating container, a seed crystal attached to the wire, for growing a single crystal of the crystal material according to a pulling method, are characterized in that a reference position of the seed crystal, the rate of the seed crystal, and the rate of the heating container are detected, the wire is unwound to lower the end of the wire to a position spaced by a first predetermined distance from the reference position, the wire is left above the melt for a predetermined time period so that the wire is extended due to heat by a constant amount, the wire is pulled upward above said reference position to correct the wire for the extension due to the weight of the single crystal attached to the wire, the seed crystal is lowered at a predetermined lowering rate to reduce an error in a position at which the seed crystal is stopped, the seed crystal is stopped at a position spaced by a second predetermined distance from the reference position, the heating container is raised at a predetermined raising rate, and the heating container is stopped when the seed crystal has come into contact with the melt.

DESCRIPTION OF THE PREFERRED EMBODIMENTS

Figure 3:
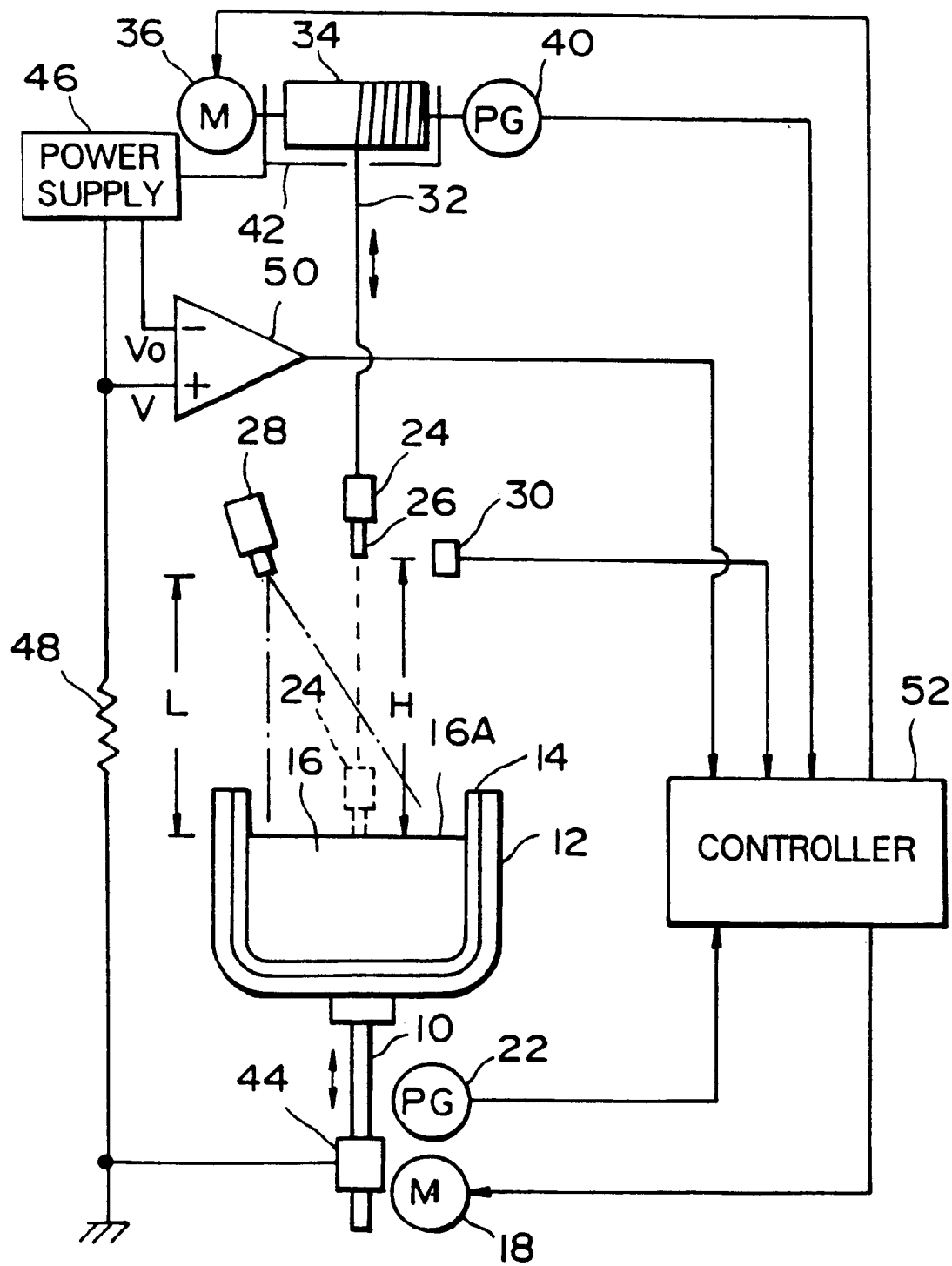
FIG. 3 is a schematic diagram illustrating the configuration of an embodiment of a melt surface initial position adjusting apparatus according to the present invention.

One embodiment of the present invention will hereinafter be described in detail with reference to the accompanying drawings. FIG. 3 illustrates the configuration of an embodiment of a melt surface initial position adjusting apparatus according to the present invention.

As illustrated in FIG. 3, the melt surface initial position adjusting apparatus comprises a quartz crucible 14, a wire 32, a seed chuck 24, a seed crystal 26, a reference position sensor 30, and a controller 52.

The controller 52, based on a microcomputer or the like, comprises a CPU (Central Processing Unit), a ROM (Read Only Memory), a RAM (Random Access Memory), and so on, not shown.

The quartz crucible 14 is accommodated in a graphite crucible 12. The quartz crucible 14 and the graphite crucible 12 correspond to a heating container. Highly pure polycrystalline silicon is contained in the quartz crucible 14 and heated by a heater disposed around the graphite crucible 12 to temperatures higher than the melting point of silicon (approximately 1,400° C.). Thus, molten polycrystalline silicon is contained in the crucible 14. Reference numeral 16A designates the surface of the melt A crucible moving shaft 10 is secured to the bottom of the graphite crucible 12 and vertically movably supported by a bearing 44. A motor 18 is mounted to a crucible moving shaft 10 for driving the crucible 12 in the vertical direction. The motor 18 is controlled by the controller 52 in terms of its start-up, rotational speed, stoppage, and so on. A pulse generator 22 is mounted to the crucible moving shaft 10 for outputting a number of pulses proportional to a vertical moving rate of the crucible moving shaft 10 to the controller 52. The controller 52 detects a vertical moving rate of the crucible moving shaft 10 based on the number of pulses supplied thereto.

On the surface 16A of molten silicon, a seed crystal 26, which is silicon single crystal, is held by a wire 32 to which the seed crystal 26 is attached through a seed chuck 24. The wire 32 is a stranded wire such as a steel stranded wire or the like, and wound around a drum 34. The drum 34 is a cylinder made of steel or the like having a spiral groove or the like formed in the surface thereof such that the wire 32 is fitted in the spiral groove. The rotating shaft of the drum 34 is made, for example, of steel, to which a motor 36 is mounted for rotating the drum 34. With the structure mentioned above, the drum 34 is rotated in rotating directions of the motor 36 to wind and unwind the wire 32. The motor 36 is controlled by the controller 52 in terms of its start-up, rotational speed, stoppage, and so on.

Figure 1:
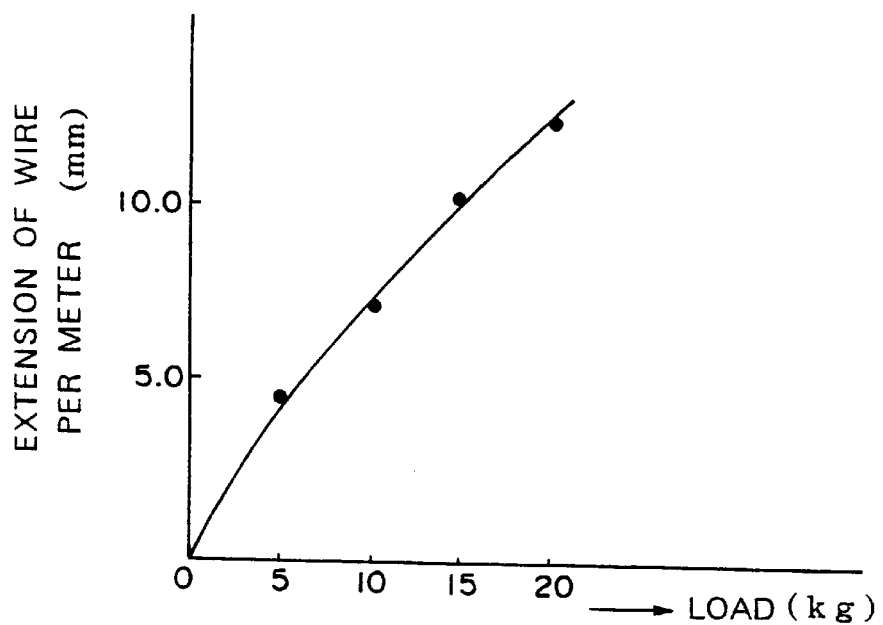
FIG. 1 is a graph illustrating the relationship between the weight of a single crystal and an extension of a wire in a conventional single crystal puller.
Figure 2:
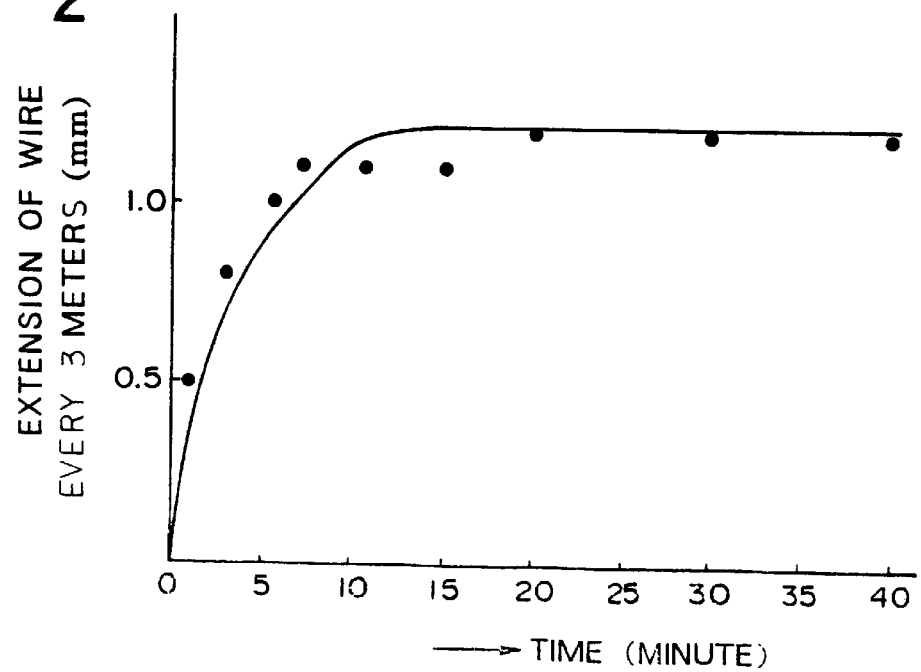
FIG. 2 is a graph illustrating the relationship between heat (time for which a wire is left above a melt) and an extension of the wire in a conventional single crystal puller.

A threaded rod, not shown, is mounted to the motor 36 such that the rotation of the motor 36 causes the threaded rod to move in the axial direction of the drum 34 (in the horizontal direction in FIG. 1). With the structure mentioned above, when the motor 36 is rotated to rotate the drum 34 in a predetermined direction, the wire is unwound. In this event, the movement of the threaded rod enables the wire 32 to vertically lower without being bent in the horizontal direction.

A pulse generator 40 is mounted to the rotating shaft of the drum 34 for supplying the controller 52 with a number of pulses proportional to a rotating amount of the drum 34 and with a signal indicative of forward or reverse rotation of the drum 34. The controller 52, thus, can measure the rotating amount of the drum 34 by means of the pulse generator 40 to measure a vertical moving amount of the wire 32.

The position of the seed crystal 26 is detected by a reference position detector 30, disposed at a height H from the melt surface 16A, which outputs a signal indicating the position of the seed crystal 26 to the controller 52.

The reference position sensor 30 comprises, for example, a light source and a photo-detector such that the photo-detector detects light from the light source interrupted by the tip of the seed crystal 26 and notifies the controller 52 of the interruption of the light, so that the controller 52 senses that the tip of the seed crystal 26 has reached the position at the height H from the melt surface 16A.

Also, an industrial television camera 28 is disposed at a height L from the melt surface 16A for controlling the diameter of a single crystal.

The bearing 44 is electrically connected to an output terminal of a direct-current (DC) power supply 46 through a resistor 48. The DC power supply 46 has the other output terminal electrically connected to a base 42 for supporting the rotating shaft of the drum 34. Also, a comparator 50 is electrically connected to the resistor 48 and the DC power supply 46 as illustrated in FIG. 3, and an output of the comparator 50 is coupled to the controller 52.

In the above configuration, an input $V_0$ at an inverting terminal is generally higher than an input V at a non-inverting terminal in the comparator 50 ($V_0$>V), so that a voltage at an output of the comparator 50 is at a low level. However, when the tip of the seed crystal 26 is brought into contact with the melt 16, a current flows from the power supply 46 through a circuit formed of the base 42, drum 34, wire 32, seed chuck 24, seed crystal 26, melt 16, quartz crucible 14, graphite crucible 12, crucible moving shaft 10, bearing 44, and resistor 48. Thus, $V_0$<V stands, so that the voltage at the output of the comparator 50 goes high. The controller 52 detects from this result that the seed crystal 26 has been brought into contact with the melt 16.

With the structure mentioned above, the motor 36 is rotated by an instruction of the controller 52 to unwind the wire 32 to lower the seed crystal 26. Upon detecting that the tip of the seed crystal 26 has been brought into contact with the melt surface 16A, the controller 52 stops lowering the seed crystal 26. Then, the motor 36 is rotated in the reverse direction by an instruction of the controller 52 to wind the wire 32 to pull the seed crystal, thus starting a single crystal growth. Subsequently, an output signal from the industrial television camera 28 is processed to measure an apparent crystal diameter d on the interface between a silicon single crystal and the melt 16. A pulling rate is controlled so that the crystal diameter is equal to a predetermined value based on the measured value d. With additional adjustments to temperature and so on, a silicon single crystal ingot can be produced substantially in a cylindrical shape. During the growth of the single crystal, the graphite crucible 12 and the quartz crucible 14 as well as the wire 32 are rotated by rotating mechanisms, not shown, in their respective predetermined directions.

However, as mentioned above, assuming that the distance between the industrial television camera 28 and the melt surface 16A is L, a reference value for L is $L_0$, and an apparent diameter of a single crystal imaged on the industrial television camera 28 is d, an actual diameter D of the single crystal is a function of $X=L-L_0$. Thus, a change in the reference value $L_0$ causes a deviation in the relationship between the apparent diameter d measured by the industrial television camera 28 and the actual diameter D, so that the diameter of the single crystal cannot be maintained at a predetermined value.

In this embodiment, the diameter of the single crystal is controlled so as to solve the above-mentioned problem, as described below.

Figure 4:
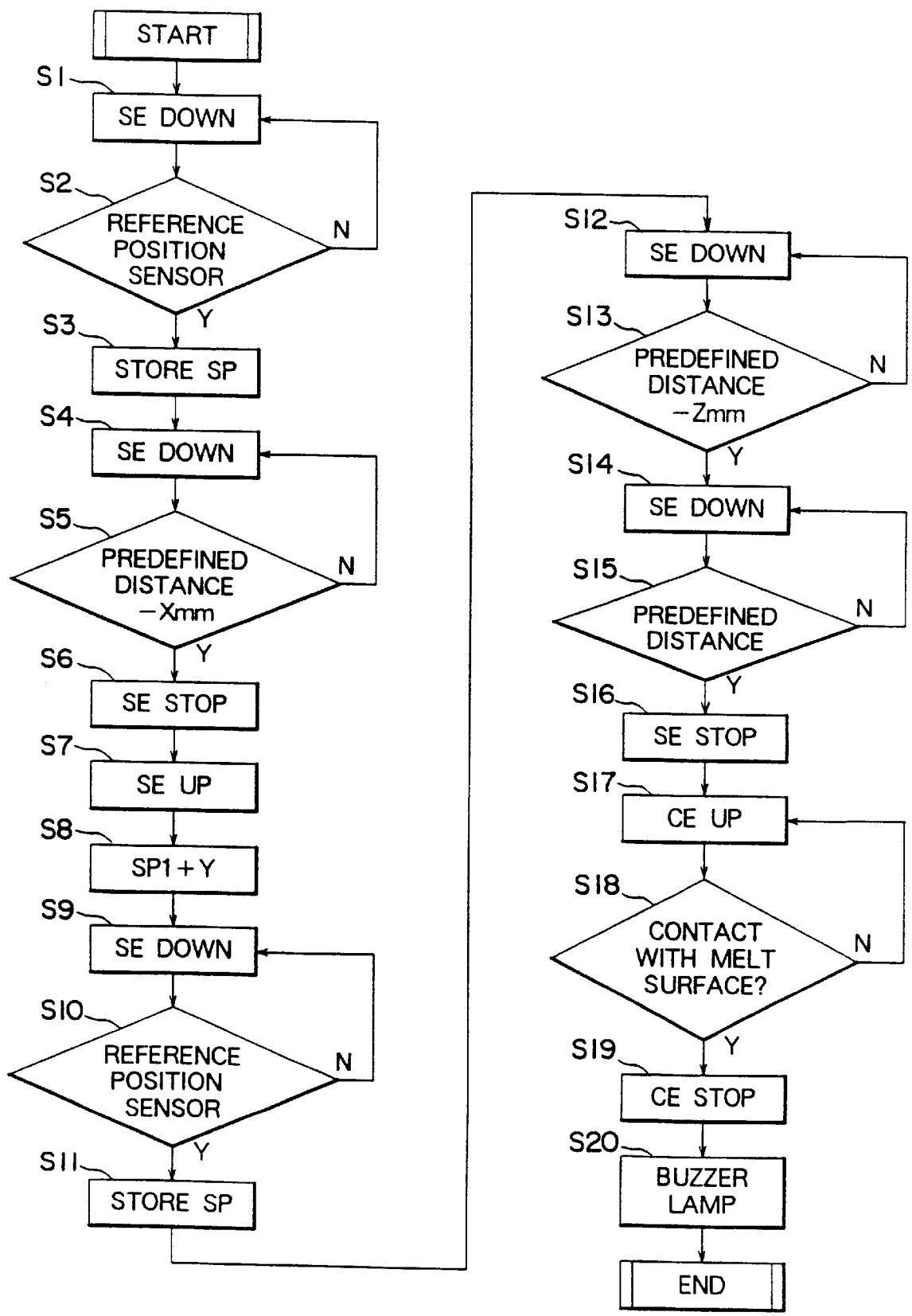
FIG. 4 is a flow chart for explaining a method of adjusting an initial position of the surface of a melt implemented in the melt surface initial position adjusting apparatus illustrated in FIG. 3.

A method of adjusting an initial position of the surface of a melt in the melt surface initial position adjusting apparatus according to this embodiment will be described below with reference to FIG. 3 illustrating the configuration of the apparatus and to FIG. 4 illustrating a flow chart of the adjusting method.

Prior to executing the procedure illustrated in FIG. 4, preparation is made for an automatic measurement of an initial position of the melt surface.

First, the controller 52 rotates the motor 36 in a predetermined direction to bring the seed crystal 26 to a position slightly higher than a reference position. The controller 52 also rotates the motor 18 in a predetermined direction to bring the graphite crucible 12 and the quart crucible 14 to a position lower than the position which is defined as an initial position of the melt surface. It should be noted in this event that if the crucibles and the seed crystal are rotated at constant rotational speeds, a measurement accuracy is further improved.

After the above-mentioned preparation has been completed, the controller 52 rotates the motor 36 in the predetermined direction to lower the seed crystal 26 (step S1 in FIG. 4). In this event, the reference position sensor 30 is disposed at a preliminary determined reference position. Next, the controller 52 determines whether or not the tip of the seed crystal 26 has reached the reference position (step S2). If the controller 52 determines that the tip of the seed crystal 26 has reached the reference position, the reference position is stored in a RAM (not shown) or the like in the controller 52 as SP1 (step S3).

Next, the controller 52 rotates the motor 36 in the predetermined direction to further lower the seed crystal 26 (step S4). The controller 52 has calculated, based on the reference position SP1, the distance from the reference position SP1 to the position which is to be defined as an initial position of the melt surface (the distance is hereinafter referred to as the "predefined distance W"), i.e., an amount over which the seed crystal 26 is lowered until it reaches the initial position of the melt surface. Then, the controller 52 determines whether or not the seed crystal 26 has been lowered over a distance W–X from the reference position, i.e., whether the seed crystal 26 has reached a position higher by X than the position which is to be defined as the initial position of the melt surface (step S5). The predetermined distance W is calculated based on the disposed position of the reference position sensor 30 and the reference value $L_0$ for the distance between the industrial television camera 28 and the melt surface 16A. The value of X is selected to be 35 millimeters by way of example. The determination at step S5 is made by the controller 52 which calculates a lowering amount of the seed crystal 26 based on a rotating amount of the drum 34. The value (W–X) corresponds to a first predetermined value.

The above-mentioned procedure is performed in order to eliminate an erroneous measurement of the length of the wire 32 by previously contracting the wire 32, and then winding and unwinding the wire 32 around and from the drum 34. The contraction of the wire 32 is provided by previously realizing a phenomenon in which the wire 32 extended due to a single crystal attached thereto, with its strand loosened, is contracted by removing the single crystal therefrom to cause the strand of the wire 32 to restore.

Next, upon detecting that the tip of the seed crystal 26 has reached the position W–X, the controller 52 stops the motor 36 to maintain the seed crystal 26 unmoved at that position for ten minutes (step S6).

This step is performed to prevent an erroneous measurement of the length of the wire 32 by previously realizing a phenomenon in which the wire 32 is left above the high temperature melt 16 to cause the wire 32 to extend due to the high temperature, but after the lapse of ten minutes, the wire 32 does not extend any more.

Next, the controller 52 rotates the motor 36 in the direction reverse to the above to raise the seed crystal 26 (step S7), and stops the seed crystal 26 at a position higher by Y than the reference position SP1 (step S8). The value of Y is selected to be ten millimeters by way of example. The control for forcing the seed crystal 26 to reach the position Y is carried out by the controller 52 which calculates a raising amount of the seed crystal 26 based on a rotating amount of the drum 34.

Next, the controller 52 rotates the motor 36 in the predetermined direction to lower the seed crystal 26 at a lower rate than the foregoing lowering operation (step S9). The rate employed in this event is for example one millimeter/minute. The rate is controlled by the controller 52 based on a time measured by a timer (not shown) incorporated therein as software or hardware and a rotating amount of the drum 34.

This step is performed to prevent the crystal seed 26 from being stopped at a deviated position due to a "time lag" occurring from the time the reference position sensor 30 detects the tip of the seed crystal 26 to the time the seed crystal 26 is actually stopped.

Next, the controller 52 determines whether or not the seed crystal 26 has reached the reference position (step S10). The determination at step S10 is made by monitoring whether or not the tip of the seed crystal 26 has reached the reference position sensor 30. When the controller 52 determines that the tip of the seed crystal 26 has reached the reference position, the reference position is stored in the RAM (not shown) or the like in the controller 52 as SP2 (step S11).

Next, the controller 52 rotates the motor 36 in the predetermined direction to lower the seed crystal 26 (step S12). The rate in this event may be similar to the rate at steps S1 and S4.

Next, the controller 52 determines based on the reference position SP2 whether or not the seed crystal 26 has lowered over the distance W–Z from the reference position SP2, i.e., whether the seed crystal has reached a position higher by Z than the position which is to be defined as the initial position of the melt surface (step S13). The value employed for Z is, for example, five millimeters. The determination at step S13 is made by the controller 52 which calculates a lowering amount of the seed crystal 26 based on a rotating amount of the drum 34.

Next, the controller 52 rotates the motor 36 in the predetermined direction to lower the seed crystal 26 at a lower lowering rate as is the case of step S9 (step S14). The lowering rate and a method of controlling the rate are similar to those used at step S9.

Next, the controller 52 determines based on the reference position SP2 whether or not the seed crystal 26 has been lowered over the predefined distance W from the reference position SP2, i.e., whether or not the seed crystal 26 has reached the position to be defined as the initial position of the melt surface (step S15). The determination at step S15 is made by the controller 52 which calculates a lowering amount of the seed crystal 26 based on a rotating amount of the drum 34. The value W corresponds to a second predetermined value.

When the controller 52 determines that the seed crystal 26 has reached the position lower by the predefined distance W than the reference position SP2, i.e., that the seed crystal 26 has reached the position to be defined as the initial position of the melt surface, the controller 52 stops the motor 36 to maintain the seed crystal 26 at that position (step S16).

Next, the controller 52 rotates the motor 18 in the predetermined direction to raise the graphite crucible 12 and the quartz crucible 14 (step S17), and determines whether or not the tip of the seed crystal 26 has come into contact with the melt surface 16A (step S18). If determining that the tip of the seed crystal 26 has come into contact with the melt surface 16A, the controller 52 stops raising the crucibles (step S19). The determination as to whether the tip of the seed crystal 26 has come into contact with the melt surface 16A is made based on an output voltage from the comparator 50.

Next, the controller 52 outputs signals to a buzzer and a lamp, not shown, to force them to generate an alarm and blink, respectively, to notify the operator or the like of the termination of the adjustment of the initial position of the melt surface (step S20).

Figure 5:
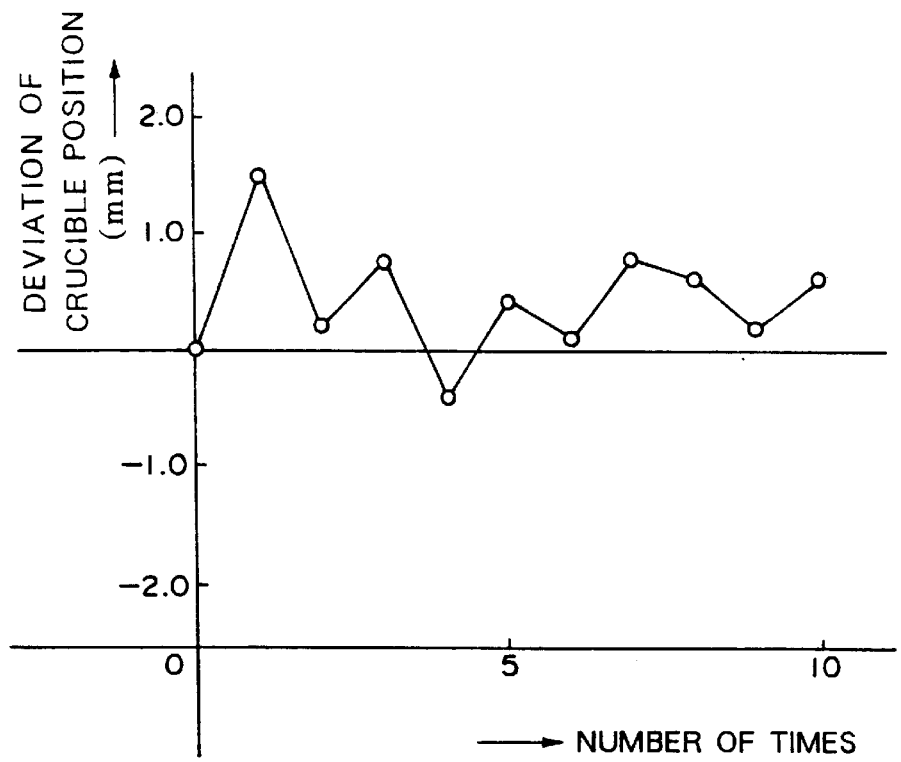
FIG. 5 is a graph representing the relationship between deviations in the position of a crucible and the number of times of measurements in a conventional manual melt surface initial position adjusting operation.
Figure 6:
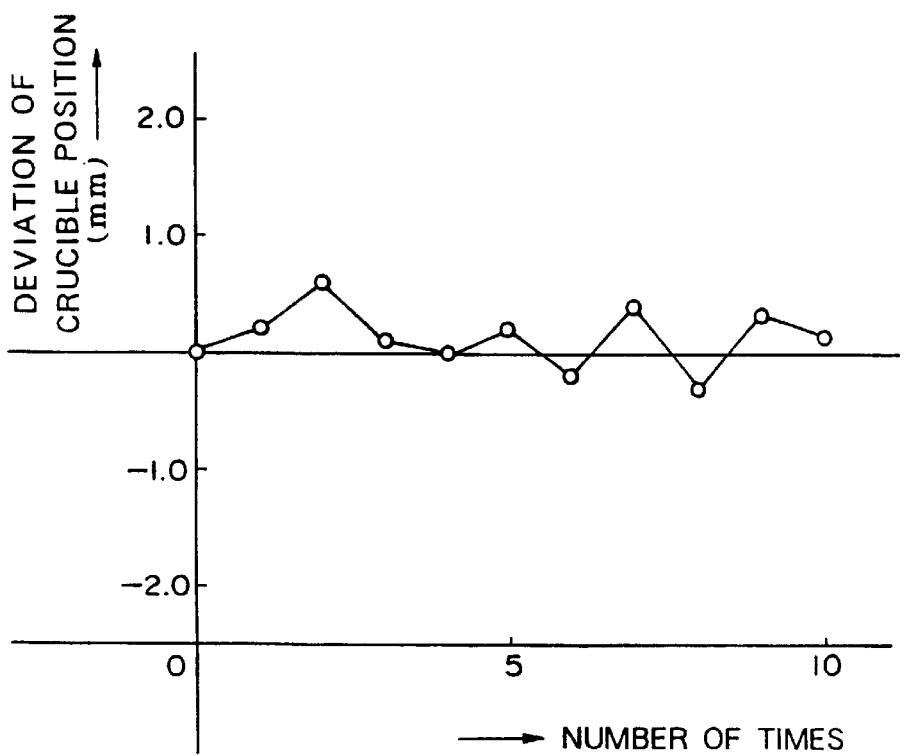
FIG. 6 is a graph representing the relationship between deviations in the position of a crucible and the number of times of measurements in the melt surface initial position adjusting apparatus illustrated in FIG. 3.

The conventional melt surface initial position adjusting method sometimes exhibits a deviation of the crucible position more than one millimeter as illustrated in FIG. 5 and has large variations in respective pulling operations. On the other hand, in the present invention, deviations of the crucible position converge within one millimeter with less variations in respective pulling operations, as can be seen from FIG. 6, in consequence of the automatic adjustment of the initial position of the melt surface, as described in connection with the foregoing embodiment.

It should be noted that the present invention is not at all limited to the foregoing embodiment The foregoing embodiment is merely illustrative, and any modifications, variations, alternations, or the like having substantially the same configuration as and similar effects to a technical thought set forth in the appended claims are encompassed by the technical scope of the present invention.

For example, while the foregoing embodiment has been described in connection with a semiconductor material such as silicon as an exemplary material for producing a single crystal, the present invention is not limited to this specific material, and any other crystal material may be used instead.

Also, while an industrial television camera is used for measuring the diameter of a single crystal in the foregoing embodiment, the present invention is not limited to the use of the television camera for the measurement Alternatively, any other imaging means, for example, a solid-state image device such as CCD may also be used.

Further, while a DC power supply is used as the power supplied in the foregoing embodiment, the present invention is not limited to the DC power supply, and an alternate current power supply may also be used.

Further, while the parameters X, Y, Z are set to 35, 10, and 5 millimeters, respectively, in the foregoing embodiment, the present invention is not limited to these specific values, and the parameters X, Y, Z may be set to any values other than the above.

As described above, according to the melt surface initial position adjusting apparatus and the melt surface initial position adjusting method, an initial position can be automatically adjusted for the surface of a melt without requiring manual operations of an operator or the like, so that a reduced time is advantageously required for each operation for adjusting an initial position of the surface of a melt Also advantageously, the initial position can be more accurately determined, and variations are also reduced.

What is claimed is:

1. A method of pulling a single crystal, the method comprising:

heating a crystal material in a heating container into a melt, the melt having a surface;

attaching a seed crystal to an end of a wire located above the surface of the melt;

detecting a reference position of the seed crystal;

lowering the wire such that the seed crystal is lowered to a first position lower than the reference position and above the surface of the melt; and raising the wire such that the seed crystal is raised to a second position above the reference position, wherein an extended state of the wire caused by a previous stretching of the wire by a weight of a previously grown single crystal is eliminated.

2. A method of pulling a single crystal, the method comprising:

heating a crystal material in a heating container into a melt, the melt having a surface;

attaching a seed crystal to an end of a wire located above the surface of the melt;

lowering the wire such that the seed crystal is lowered to a first position near the surface of the melt; and holding the wire such that the seed crystal stays substantially in the first position for a first period of time, wherein an expansion of the wire caused by the heat of the melt substantially stabilizes within the first period of time.

3. A method of pulling a single crystal, the method comprising:

heating a crystal material in a heating container into a melt, the melt having a surface;

attaching a seed crystal to an end of a wire located above the surface of the melt; and lowering the wire at a first lowering rate lower than a second lowering rate for a first period of time immediately prior to stopping the lowering of the wire, wherein an error in a stopped position of the wire caused by a delay in the stopping of the wire in relation to a stop instruction is reduced as compared to a corresponding error resulting from lowering the wire at the second lowering rate.

4. A method of pulling a single crystal, the method comprising:

heating a crystal material in a heating container into a melt, the melt having a surface;

attaching a seed crystal to an end of a wire located above the surface of the melt; and raising the heating container at a first raising rate to adjust an initial position of the surface of the melt, wherein an error in a stopped position of the heating container caused by a delay in the stopping of the heating container in relation to a stop instruction is reduced as compared to a corresponding error resulting from raising the heating container at a second raising rate at which the heating container is raised during crystal pulling, the first raising rate being lower than the second raising rate.

5. A method of pulling a single crystal, the method comprising:

heating a crystal material in a heating container into a melt, the melt having a surface;

attaching a seed crystal to an end of a wire located above the surface of the melt;

detecting a reference position of the seed crystal;

lowering the wire such that the seed crystal is lowered to a first position lower than the reference position and above the surface of the melt;

holding the wire such that the seed crystal stays in the first position for a first period of time;

raising the wire such that the seed crystal is raised to a second position above the reference position;

lowering the wire at a first lowering rate lower than a second lowering rate for a second period of time immediately prior to stopping the lowering of the wire;

stopping the wire such that the seed crystal is in a third position;

raising the heating container at a first raising rate lower than a second raising rate used during crystal pulling to adjust an initial position of the surface of the melt; and stopping the heating container when the seed crystal contacts the surface of the melt, wherein an extended state of the wire caused by a previous stretching of the wire by a weight of a previously grown single crystal is eliminated, an expansion of the wire caused by the heat of the melt stabilizes within the first period of time, and an error in the third position caused by delay in the stopping of the wire in relation to a stop instruction is reduced as compared to a corresponding error resulting from lowering the wire at the second lowering rate.

* * * * *